United States Patent [19]
Shiralagi

[11] Patent Number: 5,837,560
[45] Date of Patent: Nov. 17, 1998

[54] METHOD OF MASKING SUBSTRATES LEAVING EXPOSED FACETS

[75] Inventor: Kumar Shiralagi, Chandler, Ariz.

[73] Assignee: Motorola, Inc., Schaumburg, Ill.

[21] Appl. No.: 879,352

[22] Filed: Jun. 20, 1997

[51] Int. Cl.⁶ .................................................. H01L 21/033
[52] U.S. Cl. .............................. 438/39; 427/259; 430/311
[58] Field of Search ............................ 438/39, 944, 945; 427/259; 430/311; 257/388

[56] References Cited

U.S. PATENT DOCUMENTS 4,821,094  4/1989  Okazaki et al. ........................ 257/388

Primary Examiner—Charles Bowers
Assistant Examiner—Keith Christianson
Attorney, Agent, or Firm—Eugene A. Parsons

[57] ABSTRACT

A method of masking a substrate to leave an exposed facet for processing during fabrication of a semiconductor devices including providing a substrate formed of a semiconductor material and having a structure projecting therefrom, the structure including a facet. Ultraviolet light is selectively directing onto the substrate at an angle to the structure and opposite the facet so that the structure shades the facet from the ultra violet light. The ultra violet light reacts with the material to form an oxide mask on the substrate leaving the facet unmasked.

20 Claims, 1 Drawing Sheet

METHOD OF MASKING SUBSTRATES LEAVING EXPOSED FACETS

FIELD OF THE INVENTION

The present invention pertains to the fabrication of semiconductor devices and more specifically to improved masking techniques during semiconductor device fabrication.

BACKGROUND OF THE INVENTION

During semiconductor device fabrication, geographic features such as mesas, ridges, etc. are formed. These features typically project from a surface and have surfaces or facets. Material growth, etching or metalization on side facets is often desirable for various reasons, such as for the formation of contacts on only one side of a device. Currently, however, there are no known techniques for enabling processing of a single side facet.

During semiconductor device fabrication, geographic features of the device are conventionally determined by lithographic patterning. A photomask containing pattern information is prepared for each layer. An image of the photomask is projected onto the surface of a semiconductor substrate after the substrate is coated with a thin layer of photoresist. The pattern image is developed, and the exposed photo-sensitive material, in the case of a positive photoresist, is removed chemically. The desired pattern is thereby transferred from the photomask to the photoresist on the surface of the device being fabricated. The remaining photoresist serves to define areas where subsequent process steps such as etching, deposition and doping can occur. Once the desired process step has been accomplished, the remaining photoresist is removed.

One problem that arises is that the structure or substrate (generally a wafer) must be removed from the growth chamber to remove the masking material. The structure is then masked again and reintroduced into the growth chamber for re-growth.

Generally, in these prior art methods of fabricating semiconductor devices, etching is required to remove unwanted material and masks are removed by etching, solvent, or the like. During the etching and/or mask removal processes, the material of the semiconductor device has a high likelihood of being contaminated by the etchant, which contamination greatly reduces the life of the device, the operating characteristics of the device, and the reliability of the device. Further, the etching process severely damages semiconductor material adjacent the etched areas which further reduces life, operating characteristics, and reliability. Also, etching processes are very time consuming and difficult to perform.

Semiconductor processing has become extremely precise, allowing the fabrication of small devices. Primarily, this is achieved through the use of photolithographic techniques briefly described above. However, very small devices (deep submicron) cannot be achieved through photolithographic techniques.

Also, processing of a single facet of a structure may be desired for fabricating ultra small devices, growth on a single facet of a structure may be desired. Currently, growth on a facet alone cannot be accomplished.

Thus, these prior art techniques involve many process steps such as resist spinning, exposure, developing, cleaning and so on. All of these processes can introduce contamination, decrease yield, etc. A further problem that arises is that the structure or substrate (generally a wafer) must be removed from the growth chamber to remove the masking material. The structure is then masked again and reintroduced into the growth chamber for re-growth. Thus, the prior art techniques keep the wafer vacuum incompatible.

In addition to the masking and etching problems, all known prior art fabrication processes require many interspersed growing, masking and etching steps which greatly complicate and lengthen the process. For example, when epitaxial layers are grown, the wafers must be placed in a vacuum or pressure chamber to provide the atmosphere for the growth. Each time the wafer must be etched and/or masked, it must be removed from the chamber, resulting in large amounts of preparation time for each step. Also, each time wafers are removed from a chamber and subsequently replaced, the opening and preparation of the chamber (as well as the processing of the wafer) is an opportunity for additional impurities and contaminants to be introduced to the wafer.

Accordingly, it would be highly desirable to provide fabrication methods for semiconductor devices with improved masking processes.

It is a purpose of the present invention to provide a new and improved method of processing a single facet.

It is another purpose of the present invention to provide a new and improved masking method enabling the fabrication of very small devices.

It is still another purpose of the present invention to provide a new and improved method of masking substrates during the fabrication of semiconductor devices which does not require the introduction of contaminants, such as photoresist, solvents and etchants.

SUMMARY OF THE INVENTION

Briefly, to achieve the desired objects of the instant invention in accordance with a preferred embodiment thereof, provided is a method of masking a substrate to leave an exposed facet for processing during fabrication of a semiconductor devices. The method includes providing a substrate formed of a semiconductor material and having a structure projecting therefrom, the structure including a facet. Ultraviolet light is selectively directing onto the substrate at an angle to the structure and opposite the facet so that the structure shades the facet from the ultra violet light. The ultra violet light reacts with the material to form an oxide mask on the substrate leaving the facet unmasked.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DESCRIPTION OF THE PREFERRED EMBODIMENT

Figure 1:
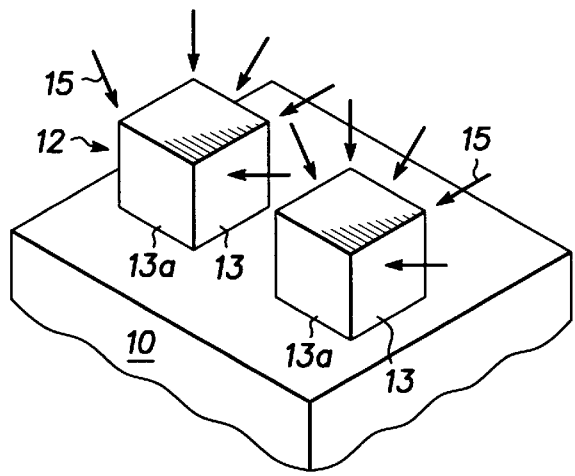
FIGS. 1–4 are simplified fragmentary views of several sequential steps in processing a facet of a structure in accordance with the present invention.

Turning now to the drawings in which like reference characters indicate corresponding elements throughout the several views, attention is directed to FIGS. 1–4 which illustrate several steps in a method of processing a single facet of a geographic structure on a substrate. Referring specifically to FIG. 1, a gallium arsenide substrate 10 is provided. It should be understood that gallium arsenide substrate 10 is utilized herein for purposes of this description but other III–V compounds and other semiconductor materials such as silicon can be utilized as will be made apparent herein. It should also be understood that substrate 10 might simply be a supporting structure, such as a wafer or the like, or it might include various layers formed on or in the supporting structure.

Substrate 10 is patterned to include a mesa 12 having a plurality of facets 13 one of which 13a is to be processed. Facet 13a is a generally upright facet or side. It will be understood that the method of the present invention can be employed to process any of facets 13 being generally upright (can be sloped) with respect to the surface of substrate 10. Furthermore, while a mesa 12 is illustrated in this embodiment, other geographic features such as ridges, trenches etc., which have generally upright facets, can be employed in the method of the present invention. It should also be understood that these geographic features may be complete, semi-complete or the beginnings of devices. For example, if mesa 12 is a complete device, a contact may be required on one side. In this case facet 13a or other facets 13 may be metalized using the method of the present invention to provide a contact on only one side of the device. Also, very small (deep submicron) device fabrication can be accomplished by providing a very small facet as the starting material. The present method also permits lateral fabrication of devices.

The Surface of gallium arsenide substrate 10 and mesa 12 typically has a film (generally 20 Angstroms or less) of a native oxide which, as is well known in the art, forms generally instantaneously upon exposure to air. It should be understood that the native oxide is not always necessary to the present invention but is generally present and requires special procedures to prevent. In some applications various types of passivation may be used, to prevent the formation of the native oxide film, in which case such passivation may have to be removed before the present procedure can be performed. It has been found that the present technique will operate generally as described with the surface simply being clean (i.e. no foreign matter).

Still referring to FIG. 1, substrate 10 and mesa 12 are exposed to a bright light preferably including deep ultraviolet, represented by arrows 15. The bright light may be, for example, the type typically used in aligners, steppers, or E-beam devices in the semiconductor industry. The term "deep ultraviolet" refers to light in the ultraviolet range, generally with a wavelength in the range of 180 to 250 nanometers. It is believed that the UV light generates ozone in the presence of oxygen due to optical excitation. Therefore, an excitation wavelength that is most suitable for efficient ozone generation is also the most efficient to use, although virtually any ultraviolet light will produce the desired result. It is believed that exposure to UV light, modifies the composition of the native oxide by forming a different kind of oxide (UV oxide), or complex oxide molecules that are more stable than the native oxide. The exposure to light can be performed under a lamp. However, when the light is collimated, as in an aligner or stepper, sharp features can be defined.

In previous processes, masks are employed to differentiate areas to be processed from other areas. In the present invention, the geographic features or structures having a facet to be processed is used as a mask. Ultraviolet light is selectively directed onto substrate 10 and mesa 12 at an angle. The angle is determined by the facet to be processed. In this example, facet 13a is to be processed, therefore ultraviolet light is selectively directed toward mesa 12 from a side opposite facet 13a so that mesa 12 shades facet 13a from the ultra violet light. The ultra violet light reacts with the gallium arsenide and converts the native oxide ($GaAsO_3$) to a thicker and denser UV oxide ($Ga_2O_3$), to form an oxide film 20 on substrate 12 while leaving facet 13a unmasked as can be seen in FIG. 2.

As will become apparent presently, one of the major advantages of the present technique is that photolithography and the like are not necessary for the described masking operations. This reduces complexity and the number of steps required and also greatly reduces chances of contamination.

Figure 2:
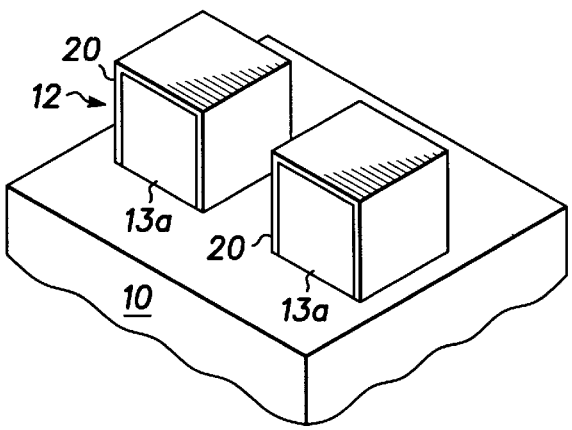

Still referring to FIG. 2, once oxide film 20 is grown, it can be employed as a mask for the subsequent processing of facet 13a, such as growth, etching, metalization and so on, and can be easily removed in situ by heating, if necessary. As an example of further operations, substrate 10 is then introduced into a growth chamber (not shown) and heated to a temperature of approximately 580° C. to desorb any native oxide that may still be present on facet 13a.

Figure 3:
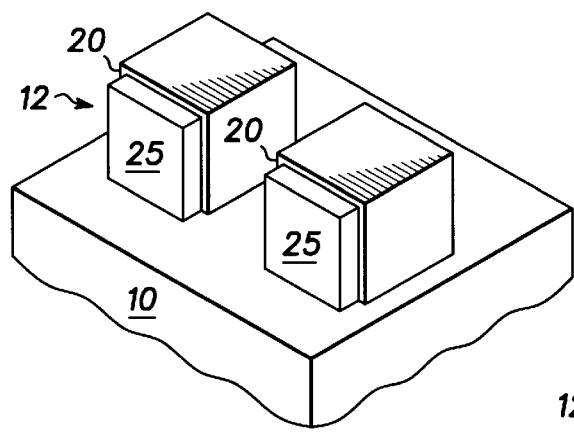

While retaining substrate 10 in the growth chamber, selective growth of crystalline, or semiconductor, material 25 on facet 13a is performed, as illustrated in FIG. 3. With oxide film 20 in place as a mask, a predetermined amount of crystalline material 25 is selectively or epitaxially grown on facet 13a. It will be understood that while epitaxial growth is illustrated as the process used on facet 13a, other processes can be employed such as etching or metalization.

Figure 4:
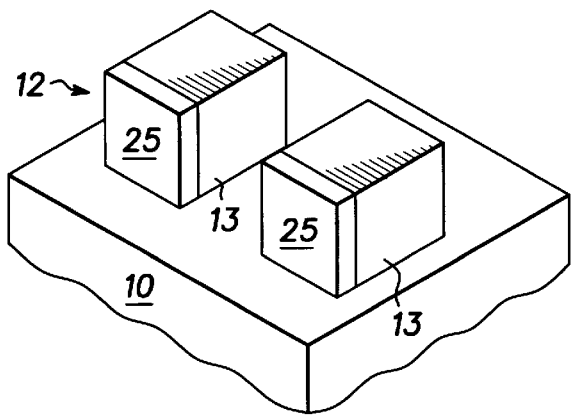

Once the desired amount of material 25 is grown on facet 13a, substrate 10 is heated to a higher temperature (approximately, 640° C.) in the growth chamber to desorb oxide film 20, resulting in the structure illustrated in FIG. 4. Thus, the mask utilized for processing of facet 13a is desorbed, or removed, in situ, i.e. without the need to remove substrate 10 from the growth chamber.

Because the new and improved method of masking gallium arsenide substrates does not require the introduction and removal of wafers or substrates from processing chambers several times in sequence during the fabrication of semiconductor devices, the fabrication process is much simpler and includes less chance of contamination of the devices. The present novel process allows processing, all in-situ, without exposure to air and contamination during the intermediate processing steps between epitaxy, etc. By eliminating air and other contaminant exposure between steps, the novel process ensures good quality in subsequent epitaxial steps. Furthermore, by eliminating the use of photoresist, problems associated therewith are also eliminated.

While the previous example employed gallium Arsenide as the material of substrate 10 and mesa 12, other semiconductor materials such as silicon can also be employed. In the case of silicon, the previously described method need only be altered by the inclusion of a hydrogen passivation step. This step, in which the surface of substrate 10 and mesa 12 are hydrogen passivated, is performed prior to the exposure to ultraviolet light. This allows the reaction with the ultra-violet light to take place.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A method of masking during fabrication of semiconductor devices comprising the steps of:

providing a substrate including a semiconductor material and having a structure projecting therefrom, the structure including a facet; and selectively directing ultraviolet light onto the substrate at an angle to the structure and opposite the facet so that the structure shades the facet from the ultra violet light, the ultra violet light reacting with the material to form an oxide mask on the substrate leaving the facet unmasked.

2. A method of masking during fabrication of semiconductor devices as claimed in 1 wherein the step of providing a structure with a facet includes providing a structure with a generally upright facet.

3. A method of masking during fabrication of semiconductor devices as claimed in claim 1 wherein the step of selectively directing ultraviolet light onto the substrate includes directing deep ultraviolet light onto the substrate.

4. A method of masking during fabrication of semiconductor devices as claimed in claim 1 wherein the step of selectively directing ultraviolet light onto the unmasked portion includes directing ultraviolet light with a wavelength in a range of 180 nm to 250 nm.

5. A method of masking during fabrication of semiconductor devices as claimed in claim 1 wherein the material includes a III–V material.

6. A method of masking during fabrication of semiconductor devices as claimed in claim 1 wherein the material includes gallium arsenide.

7. A method as claimed in claim 6 further including forming a native oxide on the substrate prior to selectively directing ultraviolet light, the ultra violet light converting the native oxide to a UV oxide.

8. A method of masking during fabrication of semiconductor devices as claimed in claim 1 wherein the material is silicon.

9. A method as claimed in claim 8 further including hydrogen passivating the substrate prior to selectively directing ultraviolet light, the ultra violet light converting the hydrogen passivated material to an oxide.

10. A method of processing a facet during fabrication of semiconductor devices comprising the steps of:

providing a substrate including a semiconductor material and having a structure with a facet;

selectively directing ultraviolet light onto the substrate at an angle to the structure and opposite the facet so that the structure shades the facet from the ultra violet light to grow an oxide film on the substrate and leave the facet exposed;

processing the exposed facet, utilizing the oxide film as a mask; and removing the oxide mask.

11. A method of processing a facet during fabrication of semiconductor devices as claimed in claim 10 wherein the step of providing a structure with a facet includes providing a structure with a generally upright facet.

12. A method of processing a facet during fabrication of semiconductor devices as claimed in claim 10 wherein the step of selectively directing ultraviolet light onto the substrate includes directing deep ultraviolet light onto the substrate.

13. A method of processing a facet during fabrication of semiconductor devices as claimed in claim 10 wherein the step of selectively directing ultraviolet light onto the unmasked portion includes directing ultraviolet light with a wavelength in a range of 180 nm to 250 nm.

14. A method of processing a facet during fabrication of semiconductor devices as claimed in claim 10 wherein the material is a III–V material.

15. A method of processing a facet during fabrication of semiconductor devices as claimed in claim 10 wherein the material is gallium arsenide.

16. A method as claimed in claim 15 further including forming a native oxide on the substrate prior to selectively directing ultraviolet light, the ultra violet light converting the native oxide to a UV oxide.

17. A method of processing a facet during fabrication of semiconductor devices as claimed in claim 10 wherein the material is silicon.

18. A method as claimed in claim 17 further including hydrogen passivating the substrate prior to selectively directing ultraviolet light, the ultra violet light converting the hydrogen passivated material to an oxide.

19. A method of processing a facet during fabrication of semiconductor devices as claimed in claim 10 wherein the step of processing the exposed facet includes a step selected from the following: selective growth; etching; and metalization.

20. A method of processing a facet during fabrication of semiconductor devices as claimed in claim 10 wherein the step of removing the mask includes heating the substrate to desorb the oxide film.

* * * * *